(12) United States Patent
Xing et al.

(10) Patent No.: US 11,409,362 B2
(45) Date of Patent: Aug. 9, 2022

(54) TOUCH BUTTON COMPONENT, VIBRATION SENSOR COMPONENT, AND ELECTRONIC DEVICE

(71) Applicant: Huawei Technologies Co., Ltd., Shenzhen (CN)

(72) Inventors: Zengping Xing, Dongguan (CN); Maosheng Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/025,113

(22) Filed: Sep. 18, 2020

(65) Prior Publication Data

US 2021/0004089 A1  Jan. 7, 2021

Related U.S. Application Data

(63) Continuation of application No. PCT/CN2019/076506, filed on Feb. 28, 2019.

(30) Foreign Application Priority Data

Mar. 19, 2018 (CN) .......................... 201810224372.0

(51) Int. Cl.
*G06F 3/0354* (2013.01)
*G06F 3/01* (2006.01)
*G01H 1/00* (2006.01)
*G06F 3/02* (2006.01)

(52) U.S. Cl.
CPC ............... *G06F 3/016* (2013.01); *G01H 1/00* (2013.01); *G06F 3/02* (2013.01)

(58) Field of Classification Search
None
See application file for complete search history.

(56) References Cited

U.S. PATENT DOCUMENTS

| | | | |
|---|---|---|---|
| 8,300,027 B2 | 10/2012 | Kim et al. | |
| 8,519,982 B2 | 8/2013 | Camp, Jr. et al. | |
| 9,274,660 B2 | 3/2016 | Bernstein et al. | |
| 9,740,381 B1 | 8/2017 | Chaudhri et al. | |
| 2010/0165794 A1 | 7/2010 | Takahashi et al. | |
| 2010/0253652 A1 | 10/2010 | Homma et al. | |
| 2011/0167391 A1 | 7/2011 | Momeyer et al. | |
| 2011/0261021 A1 | 10/2011 | Modarres et al. | |
| 2012/0270605 A1 | 10/2012 | Garrone et al. | |
| 2015/0277612 A1 | 10/2015 | Sugiyama et al. | |
| 2018/0059857 A1* | 3/2018 | Kumada ............... | G06F 3/0234 |

(Continued)

FOREIGN PATENT DOCUMENTS

| | | |
|---|---|---|
| CN | 102687100 A | 9/2012 |
| CN | 203326978 U | 12/2013 |
| CN | 104821813 A | 8/2015 |

(Continued)

*Primary Examiner* — Carl Adams
(74) *Attorney, Agent, or Firm* — Conley Rose, P.C.

(57) ABSTRACT

A touch button component with a vibration sensor component to implement a touch button attached to an inner surface of a housing, where a drive system drives the housing to vibrate, and vibration of the housing is suppressed when the housing is subjected to a touch force. When it is identified that a case in which the vibration of the housing is suppressed meets a force habit of a user, a trigger signal is output.

20 Claims, 10 Drawing Sheets

(56) References Cited

U.S. PATENT DOCUMENTS

2018/0164938 A1    6/2018  Li
2018/0204426 A1*  7/2018  Nagisetty ................. G08B 6/00

FOREIGN PATENT DOCUMENTS

| CN | 104885040 A | 9/2015 |
|----|-------------|--------|
| CN | 106301324 A | 1/2017 |
| CN | 102236463 B | 6/2017 |
| JP | 2014067219 A | 4/2014 |
| KR | 20120113253 A | 10/2012 |
| KR | 101402535 B1 | 6/2014 |

* cited by examiner

TOUCH BUTTON COMPONENT, VIBRATION SENSOR COMPONENT, AND ELECTRONIC DEVICE

CROSS-REFERENCE TO RELATED APPLICATIONS

This application is a continuation of International Patent Application No. PCT/CN2019/076506 filed on Feb. 28, 2019, which claims priority to Chinese Patent Application No. 201810224372.0 filed on Mar. 19, 2018. The disclosures of the aforementioned applications are hereby incorporated by reference in their entireties.

TECHNICAL FIELD

The present disclosure relates to the field of electronic products, and in particular, to a pressure touch technology.

BACKGROUND

With development of mobile device technologies, integration will become a trend, and has great advantages in aspects of waterproofing, user experience, and the like. Because a physical button is an obstacle to integration of mobile devices, how to design a virtual button is an urgent problem to be resolved in the industry.

SUMMARY

Embodiments of the present disclosure provide a touch button solution, to facilitate integration of a mobile device.

According to a first aspect, an embodiment of this application provides a touch button component, including a housing, a vibration sensor, and a comparison trigger unit, where the vibration sensor includes a drive unit and a sensing detection unit, the drive unit and/or the sensing detection unit are/is attached to an inner surface of a vibration region of the housing, the drive unit is configured to generate vibration and drive the housing to vibrate, the sensing detection unit is configured to detect vibration of the housing and output a detection signal, and the comparison trigger unit is configured to receive the detection signal and determine whether the detection signal falls within a range conforming to a touch habit of a user, and output a trigger signal when the detection signal falls within the range conforming to the touch habit of the user. In such a solution, a touch button that is attached to an inner surface of the housing may be implemented, which facilitates integration of an electronic device.

Further, the comparison trigger unit is configured to receive the detection signal, compare the detection signal with a threshold to obtain a comparison result, and output the comparison result, where the threshold is a boundary value of the range conforming to the touch habit of the user. When the comparison result indicates that the detection signal falls within the range conforming to the touch habit of the user, the output comparison result is used as the trigger signal. The "boundary value" may be an upper limit or a lower limit of the range conforming to the touch habit of the user, and the reason is as follows. When the user presses the touch button, a touch force of the user may cause a decrease in a vibration amplitude of the housing, or may cause an increase in the vibration amplitude of the housing. That is, the touch force of the user may suppress vibration of the housing, or may strengthen the vibration amplitude of the housing. When the touch force of the user suppresses vibration of the housing, the threshold is the upper limit of the range conforming to the touch habit of the user. When the touch force of the user strengthens the vibration amplitude of the housing, the threshold is the lower limit of the range conforming to the touch habit of the user.

The detection signal is used to indicate the vibration amplitude of the housing, and the detection signal may be a voltage signal, or may be a variation of a resistance value. Correspondingly, the range conforming to the touch habit of the user is an amplitude range obtained after the vibration region of the housing is subjected to a habit force used by the user to trigger the touch button. Conforming to the touch habit of the user means satisfying a touch sense of the user. The range conforming to the touch habit of the user is a range value obtained by collecting and sampling data based on touch habits of different users, and performing statistical analysis.

This application provides a virtual button architecture. The housing is driven by the drive unit of the vibration sensor to vibrate. The vibration amplitude of the housing is detected by the sensing detection unit. A touch force suppresses vibration of the housing or strengthens vibration of the housing. A relationship between the detected amplitude and the threshold is compared by the comparison trigger unit, to implement the touch button.

In an implementation, when the housing is not subjected to the touch force, the amplitude of vibration generated when the drive unit drives the housing is within a first range, and the comparison trigger unit outputs the trigger signal based on the comparison result of the detection signal and the threshold. When the touch force exerted on the housing suppresses vibration of the housing, the threshold is less than a lower limit of the first range, and when an amplitude of the detection signal is less than the threshold, the comparison trigger unit outputs the trigger signal. When the touch force exerted on the housing strengthens vibration of the housing, the threshold is greater than an upper limit of the first range, and when an amplitude of the detection signal is greater than the threshold, the comparison trigger unit outputs the trigger signal. Data of the first range is affected by factors such as a temperature and a material of an electronic device in which the touch button component is located. After a plurality of tests, a vibration amplitude that is obtained through statistics when the housing is not subjected to a touch force of a user may be a voltage signal or a variation of a resistance. The first range may be set by a master chip integrated in the electronic device or a circuit in a coprocessor, or may be set by an independent circuit that exists independently in the electronic device.

In an implementation, the comparison trigger unit includes a reference amplitude input end, a detection signal input end, and a comparator. A first end of the comparator is electrically connected to the reference amplitude input end, and is configured to input the threshold. A second end of the comparator is electrically connected to the detection signal input end, and is configured to input the detection signal. The comparator is configured to compare the amplitude of the detection signal with the threshold. An output end of the comparator is electrically connected to a control unit. The control unit is configured to output the trigger signal based on a comparison result of the comparator. The control unit may be a circuit unit of the master chip in the electronic device, may be a circuit unit in the coprocessor, or may be a circuit unit that is independent of the master chip and the coprocessor.

In an implementation, the comparison trigger unit further includes a voltage division circuit. The voltage division circuit is electrically connected between the reference amplitude input end and the first end of the comparator. When the threshold is a voltage signal, the voltage division circuit is configured to perform voltage division on the threshold, and then transfer the threshold to the first end of the comparator.

In an implementation, the touch button component further includes an amplitude discrimination unit. The amplitude discrimination unit is configured to obtain a plurality of detection signals when an outer surface of the housing is not subjected to the touch force, where the detection signal is used to indicate the vibration amplitude of the housing, and use a value with a highest occurrence probability in the plurality of detection signals as a reference value. The reference value is used to calculate the threshold. In an implementation, a specific algorithm for calculating the threshold is that the threshold is equal to a product of the reference value and a coefficient, and a value range of the coefficient is 0.1-0.9.

That is, if amplitudes of the detection signals continuously read by the amplitude discrimination unit remain stable, the amplitude discrimination unit generates a reference value, and the reference amplitude input end sets the reference value to the comparator. The amplitude discrimination unit may be disposed in the master chip or the coprocessor of the electronic device, or may be disposed as a hardware circuit that is independent of the master chip or the processor.

In an implementation, the threshold is 0.1-0.9 times the lower limit of the first range, and the first range is a range of the detection signal output by the sensing detection unit when the housing is not touched.

In an implementation, the threshold is greater than or equal to 1.1 times the upper limit of the first range, and the first range is a range of the detection signal output by the sensing detection unit when the housing is not touched.

In an implementation, a buffer zone is disposed on the inner surface of the housing, the buffer zone surrounds the vibration region, and one or more bumps convexly disposed on the inner surface of the housing are disposed on the buffer zone. The buffer zone may be integrated with the housing, and is convexly disposed on the inner surface of the housing. A specific location of the vibration region is limited by disposing the buffer zone, which helps position and install the drive unit and the sensing detection unit of the vibration sensor. The buffer zone may absorb vibration of the vibration region, which prevents vibration of the vibration region from spreading to another part of the housing.

In an implementation, there is one bump, and the bump is in an enclosed ring structure. Further, the buffer zone in the enclosed ring structure surrounds the vibration region. A shape of the region surrounded by the buffer zone may be a circular ring, an ellipse ring, a square ring, or the like. In a direction perpendicular to a casing, a shape of a cross section of the buffer zone may be a square, a triangle, a trapezoid, a semicircle, or another irregular shape. A specific shape of the buffer zone is not limited in this application.

In an implementation, there may alternatively be a plurality of bumps, and the plurality of bumps are spaced apart around the vibration region. That is, the plurality of bumps is arranged in a ring shape, and a gap is provided between adjacent bumps. In a specific implementation, the plurality of bumps is arranged equally.

In an implementation, there are two bumps, the bumps are disposed opposite to each other, and the vibration region is located between the two bumps. This implementation is applied to a middle frame of a mobile terminal, that is, the housing is a part of the middle frame. On the middle frame, the two bumps may be disposed at intervals only in a direction of extending the middle frame to form the buffer zone, to prevent vibration of the vibration region from spreading outwards, thereby improving sensitivity and reliability of the touch button.

In an implementation, a groove is disposed on the inner surface of the housing, the groove is distributed on a periphery of the vibration region, and the groove is filled with a flexible material or an elastic structure used to absorb vibration of the housing. The flexible material may be silica gel, foam, or the like, and the elastic structure may be a structure such as a spring or a spring plate. Both the flexible material and the elastic structure have performance of vibration absorbing. The flexible material or the elastic structure is disposed in the groove to absorb vibration of the vibration region, to prevent vibration of the vibration region from spreading outwards, thereby improving sensitivity and reliability of the touch button.

In an implementation, a recessed portion is disposed on the outer surface of the housing, and the vibration region is located at a bottom of the recessed portion. Further, the vibration region may include an entire region of the bottom of the recessed portion, or the vibration region may include a partial region at the bottom of the recessed portion. A thickness of the bottom of the recessed portion is less than a thickness of a part that is of the housing and that is located on a periphery of the recessed portion. Disposing of the recessed portion makes the region that is of the housing and that is for disposing the touch button thinner, to improve sensitivity of the touch button, and provides accurate positioning for the user. This is easy to operate and is not easy to cause an accidental touch.

In an implementation, the drive unit includes a first vibration sheet that is attached to the housing, a drive electrode is disposed on a surface of the first vibration sheet, and the drive electrode is configured to receive a signal of a signal generation circuit to generate vibration.

In an implementation, the sensing detection unit includes a second vibration sheet and an induction electrode formed on a surface of the second vibration sheet. The induction electrode is configured to electrically connect to a detection circuit, to transfer a vibration signal to the detection circuit. The detection circuit is configured to output the detection signal. The second vibration sheet and the first vibration sheet are disposed in a laminated manner and are connected as a whole. The drive electrode is located on a surface that is of the first vibration sheet and that is away from the second vibration sheet. The induction electrode is located on a surface that is of the second vibration sheet and that is away from the first vibration sheet. The touch button further includes a ground layer. The ground layer is sandwiched between the first vibration sheet and the second vibration sheet. The sensing detection unit and the drive unit are grounded using the ground layer.

In an implementation, a drive pad is disposed on the surface that is of the second vibration sheet and that is away from the first vibration sheet, the drive electrode is electrically connected to the drive pad, and the drive pad is configured to electrically connect to the signal generation circuit.

In an implementation, a ground pad is disposed on the surface that is of the second vibration sheet and that is away from the first vibration sheet, the ground pad is used for grounding, the ground layer is electrically connected to the ground pad, and the ground pad and the drive pad are located at edges of the second vibration sheet, and are insulated from the induction electrode.

In an implementation, the sensing detection unit is disposed on the first vibration sheet. The sensing detection unit includes an induction electrode. The induction electrode is configured to electrically connect to a detection circuit, to transfer a vibration signal to the detection circuit. The detection circuit is configured to output the detection signal. The induction electrode and the drive electrode are located in different regions of the first vibration sheet. A ground layer is further disposed on the first vibration sheet. In a direction perpendicular to the first vibration sheet, the ground layer is separately opposite to the drive electrode and the induction electrode.

In an implementation, the induction electrode and the drive electrode are disposed on a same surface of the first vibration sheet, the ground layer is disposed on the other surface of the first vibration sheet, and the surface on which the ground layer is located is configured to attach to the housing.

In an implementation, the induction electrode and the drive electrode are disposed on different surfaces of the first vibration sheet. The ground layer includes a first ground region and a second ground region that are distributed on different surfaces of the first vibration sheet. In a direction perpendicular to the first vibration sheet, the first ground region is opposite to the drive electrode, and the second ground region is opposite to the induction electrode.

In an implementation, the sensing detection unit is made of a piezoresistive material. The sensing detection unit is attached to the first vibration sheet, and is configured to detect vibration of the housing by detecting a variation of a resistance of the sensing detection unit caused by vibration of the first vibration sheet.

In an implementation, the drive unit includes a magnet and a coil. The coil is electrically connected to the signal generation circuit. The signal generation circuit drives the coil to generate an electromagnetic force effect such that the magnet generates vibration, and vibration of the magnet drives the housing to vibrate.

In an implementation, the sensing detection unit includes a vibration sheet, an induction electrode, and a ground layer. The induction electrode is configured to electrically connect to a detection circuit, to transfer a vibration signal to the detection circuit. The detection circuit is configured to output the detection signal. The induction electrode and the ground layer are located on two opposite surfaces of the vibration sheet, respectively. In a direction perpendicular to the vibration sheet, the ground layer and the induction electrode are opposite to each other. The magnet is attached to the vibration sheet, to drive the vibration sheet to vibrate.

In an implementation, the vibration sheet is attached to the housing, and the vibration sheet is located between the magnet and the housing.

In an implementation, the magnet is attached to a surface that is of the vibration sheet and on which the induction electrode is disposed, and a surface that is of the vibration sheet and on which the ground layer is disposed is attached to the housing.

In an implementation, the sensing detection unit is made of a piezoresistive material, and the sensing detection unit is attached to the magnet or the housing, and detects vibration of the sensitive region using a variation of a resistance value of the sensing detection unit.

In an implementation, the magnet is attached to the housing. The sensing detection unit includes a piezoresistive body and two connection ends disposed on a surface of the piezoresistive body. The piezoresistive body is attached to the housing. The two connection ends are located on a surface that is of the piezoresistive body and that is away from the housing. The two connection ends are configured to electrically connect to a piezoresistive detection circuit. The piezoresistive detection circuit is configured to output the detection signal based on a variation of a resistance value of the piezoresistive body. The variation value of the resistance value is an amplitude of the detection signal.

In an implementation, the sensing detection unit includes a sensing unit, an amplification circuit, and a filter circuit. The sensing unit is configured to sense vibration of the housing and output a signal. The signal output by the sensing unit successively passes through the amplification circuit and the filter circuit to form the detection signal. The filter circuit is configured to filter out other stress interference such that the detection signal corresponds only to vibration information of the housing.

According to a second aspect, this application provides a vibration sensor component, including a housing and a vibration sensor. The vibration sensor includes a drive unit and a sensing detection unit. The drive unit is configured to generate vibration and drive the housing to vibrate. The sensing detection unit is configured to detect vibration of the housing and output a detection signal. A buffer zone is convexly disposed on an inner surface of the housing. A region enclosed by the buffer zone is a vibration region. One or more bumps convexly disposed on the inner surface of the housing are disposed on the buffer zone. The drive unit and/or the sensing detection unit are/is attached to an inner surface of the vibration region.

In such a solution, a touch button that is attached to the inner surface of the housing may be implemented, which facilitates integration of an electronic device. In addition, with a design of the buffer zone, vibration of the vibration region may be prevented from spreading to another part of the housing, thereby improving precision and reliability of the vibration sensor component, and implementing a function of preventing an accidental touch. If a user touches the housing except the vibration region, the touch force does not affect vibration of the housing in the vibration region, and does not trigger the vibration sensor component.

Further, the buffer zone may be integrated with the housing, and is convexly disposed on the inner surface of the housing. A specific location of the vibration region is limited by disposing the buffer zone, which helps position and install the drive unit and the sensing detection unit of the vibration sensor. The buffer zone may absorb vibration of the vibration region, which prevents vibration of the vibration region from spreading to another part of the housing.

In an implementation, there is one bump, and the bump is in an enclosed ring structure. Further, the buffer zone may be in the enclosed ring structure that surrounds the vibration region. A shape of the region surrounded by the buffer zone may be a circular ring, an ellipse ring, a square ring, or the like. In a direction perpendicular to a casing, a shape of a cross section of the buffer zone may be a square, a triangle, a trapezoid, a semicircle, or another irregular shape. A specific shape of the buffer zone is not limited in this application. In an implementation, there may alternatively be a plurality of bumps, and the plurality of bumps are spaced apart around the vibration region. That is, the plurality of bumps is arranged in a ring shape, and a gap is provided between adjacent bumps. In a specific implementation, the plurality of bumps is arranged equally.

In an implementation, there are two bumps, the bumps are disposed opposite to each other, and the vibration region is located between the two bumps. This implementation is applied to a middle frame of a mobile terminal, that is, the housing is a part of the middle frame. On the middle frame, the two bumps may be disposed at intervals only in a direction of extending the middle frame to form the buffer zone, to prevent vibration of the vibration region from spreading outwards, thereby improving sensitivity and reliability of the touch button.

According to a third aspect, this application provides a vibration sensor component, including a housing and a vibration sensor. The vibration sensor includes a drive unit and a sensing detection unit. The drive unit is configured to generate vibration and drive the housing to vibrate. The sensing detection unit is configured to detect vibration of the housing and output a detection signal. A region that is on the housing and that is used to attach to the drive unit and/or the sensing detection unit is a vibration region. The drive unit and/or the sensing detection unit are/is attached to an inner surface of the vibration region. A groove is disposed on an inner surface of the housing. The groove is distributed on a periphery of the vibration region, and the groove is filled with a flexible material or an elastic structure used to absorb vibration of the housing. The flexible material or the elastic structure in the groove may fill only partial space of the groove, or may fully fill the groove or exceed the groove.

Further, the groove may be of a groove structure extending to form an enclosed ring, or the groove may include a plurality of small grooves. The plurality of small grooves is arranged in a ring form, and two adjacent small grooves are spaced apart. A specific ring shape of the groove through extension may be a circular ring, an ellipse ring, a square ring, or the like. In a direction perpendicular to a casing, a shape of a cross section of the buffer zone may be a square, a triangle, a trapezoid, a semicircle, or another irregular shape. A specific shape of the groove is not limited in this application.

According to a fourth aspect, this application further provides an electronic device, where the electronic device includes a casing, a chip, and the foregoing touch button component, a housing of the touch button component is a part of the casing, and the chip is configured to receive the trigger signal output by the touch button.

According to a fifth aspect, this application provides an electronic device, including a casing, a chip, and the foregoing vibration sensor component, a housing of the vibration sensor component is a part of the casing, and the chip is configured to receive the detection signal output by the sensor component.

In an implementation, the comparison trigger unit of the touch button component is integrated into the chip.

In an implementation, the mobile terminal further includes a coprocessor, and the comparison trigger unit of the touch button component is integrated into the coprocessor.

The comparison trigger unit in the touch button component provided in this application may be disposed in a sensor control chip, and may be integrated into a master chip or the coprocessor. The coprocessor is a chip configured to reduce a specific processing task of a system microprocessor, and is a processor developed and applied to assist a central processing unit in completing a processing work that cannot be performed or that is performed with low efficiency and effect by the central processing unit. Certainly, the comparison trigger unit may alternatively be disposed as a hardware circuit that is independent of the master chip or the processor.

In an implementation, the casing includes a front panel, a middle frame, and a rear cover, and the housing in the touch button component or the vibration sensor component is an outer frame of the middle frame.

In an implementation, there are at least two touch button components, and the mobile terminal further includes a general drive module, where the general drive module asynchronously drives the drive units of the at least two touch buttons in sequence, to reduce crosstalk between the touch buttons.

BRIEF DESCRIPTION OF DRAWINGS

To describe the technical solutions in some of the embodiments or the background of the present disclosure more clearly, the following describes the accompanying drawings for some of the embodiments of the present disclosure.

DESCRIPTION OF EMBODIMENTS

The embodiments of this application are described below with reference to the accompanying drawings in the embodiments of the present disclosure.

This application relates to a touch button component and a sensor component, and is applied to an electronic device. The electronic device may be a mobile terminal (for example, a smartphone), a wearable electronic device (for example, a smartwatch), a household appliance, a vehicle dashboard, and another electrical product.

The touch button component is a virtual button disposed on the electronic device, and may implement function buttons such as a volume adjustment button, an OK button, and a power button. For example, the touch button component is disposed on a casing of the mobile terminal, and a casing of the electronic device (using a mobile phone as an example) includes a front panel, a middle frame, and a rear cover. The touch button component may be disposed on the front panel, the middle frame, or the rear cover, and is electrically connected to a chip disposed in the electronic device, and the chip is configured to receive a trigger signal output by the touch button.

Figure 1:
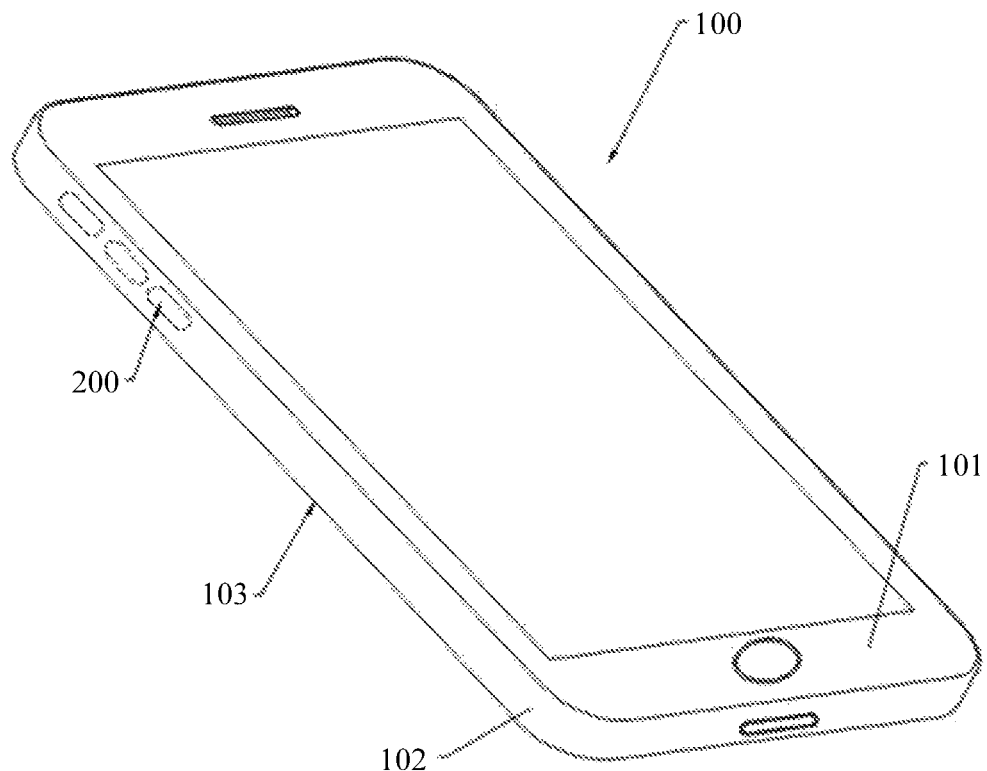
FIG. 1 is a schematic diagram of an electronic device according to this application.

As shown in FIG. 1, in an implementation, an electronic device 100 provided in this application includes a front panel 101, a middle frame 102, and a rear cover 103, and a touch button component 200 in this application is disposed on the middle frame 102. The touch button component 200 in FIG. 1 is represented by a dashed box. Because the touch button component in this application is a virtual button, namely, a non-physical mechanical button, a specific structure of the touch button component 200 cannot be seen on an outer surface of the electronic device 100. In an actual application, a mark symbol may be set on the outer surface of the electronic device 100, to inform a user of a position of the touch button, or a transparent region, a region which light can pass, or a recessed portion may be disposed on a housing of the mobile terminal 100, to determine a position of the touch button component 200 through such disposing.

Figure 2:
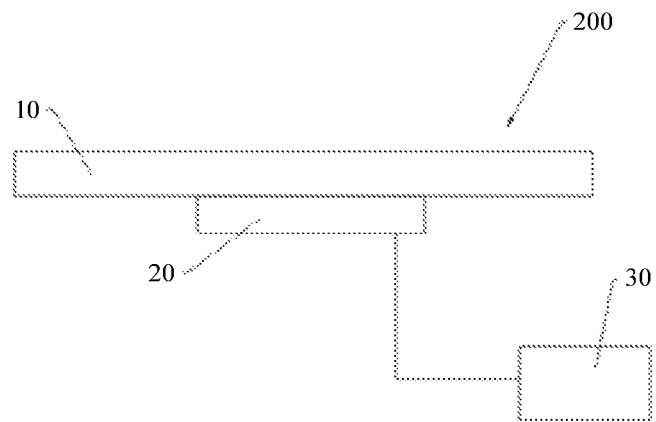
FIG. 2 is a schematic diagram of a touch button component according to an implementation of this application.

As shown in FIG. 2, the touch button component 200 provided in this embodiment of this application includes a housing 10, a vibration sensor 20, and a comparison trigger unit 30, and the vibration sensor 20 includes a drive unit and a sensing detection unit (FIG. 2 does not show the drive unit and the sensing detection unit, and the drive unit and the sensing detection unit are described in subsequent specific implementations with reference to the figure). With the touch button component 200 provided in this application, a touch button attached to an inner surface of the housing may be implemented, which helps integration of the electronic device. The drive unit and/or the sensing detection unit are/is attached to the inner surface of the housing 10. This application relates to a plurality of implementations. The drive unit may be attached to the inner surface of the housing 10, or the sensing detection unit may be attached to the inner surface of the housing 10, alternatively, both the drive unit and the sensing detection unit may be attached to the inner surface of the housing 10. The specific implementations are described in detail subsequently.

The drive unit is configured to generate vibration and drive the housing 10 to vibrate, the sensing detection unit is configured to detect vibration of the housing 10 and output a detection signal to the comparison trigger unit 30, and the comparison trigger unit 30 is configured to receive the detection signal and determine whether the detection signal falls within a range conforming to a touch habit of a user, and output a trigger signal when the detection signal falls within the range conforming to the touch habit of the user.

The comparison trigger unit 30 is further configured to compare the detection signal with a threshold to obtain a comparison result, and output the comparison result. The threshold is a boundary value of the range conforming to the touch habit of the user, and when the comparison result indicates that the detection signal falls within the range conforming to the touch habit of the user, the output comparison result is used as the trigger signal. The "boundary value" may be an upper limit or a lower limit of the range conforming to the touch habit of the user, and the reason is as follows. When the user presses the touch button, a touch force of the user may cause a decrease in a vibration amplitude of the housing, or may cause an increase in the vibration amplitude of the housing. That is, the touch force of the user may suppress vibration of the housing, or may strengthen the vibration amplitude of the housing. When the touch force of the user suppresses vibration of the housing, the threshold is the upper limit of the range conforming to the touch habit of the user. When the touch force of the user strengthens the vibration amplitude of the housing, the threshold is the lower limit of the range conforming to the touch habit of the user.

The detection signal is used to indicate a vibration amplitude of the housing, and the detection signal may be a voltage signal, or may be a variation of a resistance value, which is related to specific design forms of the drive unit and the sensing detection unit. Correspondingly, the range conforming to the touch habit of the user is an amplitude range obtained after a vibration region of the housing is subjected to a habit force used by the user to trigger the touch button. Conforming to the touch habit of the user means satisfying a touch sense of the user. The range conforming to the touch habit of the user is a range value obtained by collecting and sampling data based on touch habits of different users, and performing statistical analysis.

Figure 3:
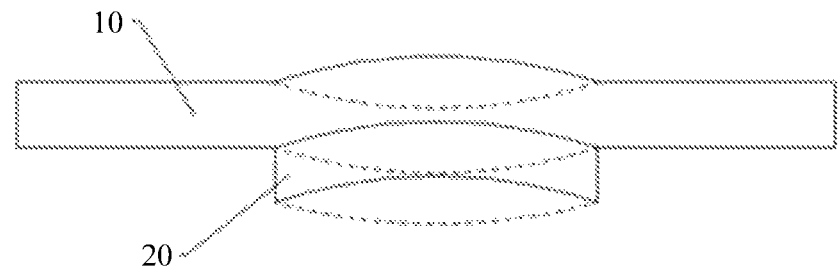
FIG. 3 is a schematic diagram of a touch button component in a vibration state and without a touch force according to an implementation of this application.
Figure 4:
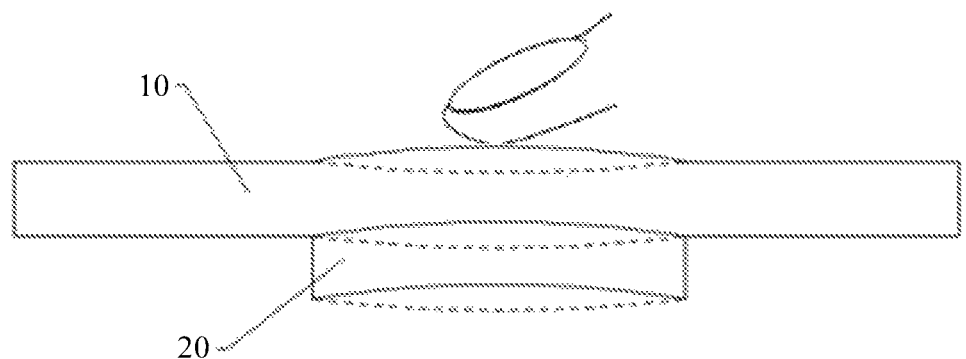
FIG. 4 is a schematic diagram after a touch force is applied to the touch button component in the vibration state shown in FIG. 3.

In an implementation, when the housing 10 is not subjected to a touch force, an amplitude of vibration generated when the drive unit drives the housing is within a first range. FIG. 2 shows that the vibration sensor 20 is not in a working state, and the housing 10 does not generate vibration. FIG. 3 is a schematic diagram of vibration of the housing 10 under an action of the drive unit when the housing 10 is not subjected to a touch force, where two position states in a vibration process are included, and are represented by a solid line and a dashed line, respectively. When an outer surface of the housing 10 is subjected to a touch force, as shown in FIG. 4, a finger of a user touches the housing 10, vibration of the housing 10 is suppressed under an action of the touch force, and the vibration amplitude of the housing 10 in the state shown in FIG. 4 is less than the vibration amplitude of the housing 10 shown in FIG. 3. Certainly, in some vibration frequency states, the vibration amplitude of the housing 10 becomes larger, that is, with the touch button component in this application, a function of the touch force on the housing 10 may also increase the vibration amplitude of the housing 10.

The comparison trigger unit 30 is configured to receive the detection signal, and output a trigger signal based on a comparison result between the detection signal and the threshold. When the touch force exerted on the housing 10 suppresses vibration of the housing 10, the threshold is less than a lower limit of the first range, and when an amplitude of the detection signal is less than the threshold, the comparison trigger unit outputs the trigger signal. When the touch force exerted on the housing 10 strengthens vibration of the housing 10, the threshold is greater than an upper limit of the first range, and when an amplitude of the detection signal is greater than the threshold, the comparison trigger unit outputs the trigger signal. Data of the first range is affected by factors such as a temperature and a material of an electronic device in which the touch button component is located. After a plurality of tests, a vibration amplitude that is obtained through statistics when the housing is not subjected to a touch force of a user may be a voltage signal or a variation of a resistance. The first range may be set by a master chip integrated in the electronic device or a circuit in a processor, or may be set by a hardware circuit that is independent of the master chip or the processor.

This application provides a virtual button architecture. The housing 10 is driven by the drive unit of the vibration sensor to vibrate. The vibration amplitude of the housing 10 is detected by the sensing detection unit. When there is a touch force to suppress vibration of the housing 10 or strengthen vibration of the housing 10, a relationship between the detected amplitude and the threshold is compared by the comparison trigger unit 30, to implement the touch button.

The first range is an amplitude range of vibration generated when the drive unit drives the housing 10 and the housing 10 is not subjected to any touch force. When the housing 10 is not interfered by any environmental factor, and is not subjected to any touch force, the amplitude of vibration generated when the drive unit drives the housing 10 should be one value. However, the mobile terminal is inevitably affected by some environmental factors, for example, a temperature change, a difference of a housing material, and a change of a user state (for example, the mobile terminal is in a user pocket, and the user is in a static state and a moving state, or contact or friction between the mobile terminal and the user changes, and all of these factors affect the vibration amplitude of the housing 10). Because of impact of these environmental factors, it is defined as follows. The amplitude range of vibration generated when the drive unit drives the housing 10 is the first range when the housing is not subjected to any touch force. The first range is set to a vibration amplitude that is obtained through a plurality of tests and statistics when there is no touch force of the user, and may be a voltage signal or a variation of a resistance.

Based on user experience or experimental data, it can be learned that it is relatively appropriate to use the threshold being less than the lower limit of the first range or greater than the upper limit of the first range as a condition for the comparison trigger unit to generate the trigger signal such that accurate determining can be performed, improving trigger accuracy and reliability of the touch button. In an implementation, the threshold is 0.1-0.9 times the lower limit of the first range, or the threshold is greater than or equal to 1.1 times the upper limit of the first range.

In this application, a buffer structure is disposed on the inner surface of the housing 10 such that vibration generated by the vibration sensor is concentrated in a region that is of the housing and that is attached to the drive unit and/or the sensing detection unit, and vibration is prevented from spreading to another region of the housing 10. In this way, sensitivity of the touch button can be ensured, and when a touch force is applied to the vibration position of the housing, the touch button is immediately started. In addition, impact caused by an accidental touch on the other region of the housing 10 on the touch button can also be prevented. Because the other region of the housing 10 is not affected by vibration of the drive unit, when a touch force exists in the other region of the housing 10, the amplitude of vibration generated when the drive unit drives the housing is not suppressed or strengthened, and therefore the touch button is not triggered.

Figure 5:
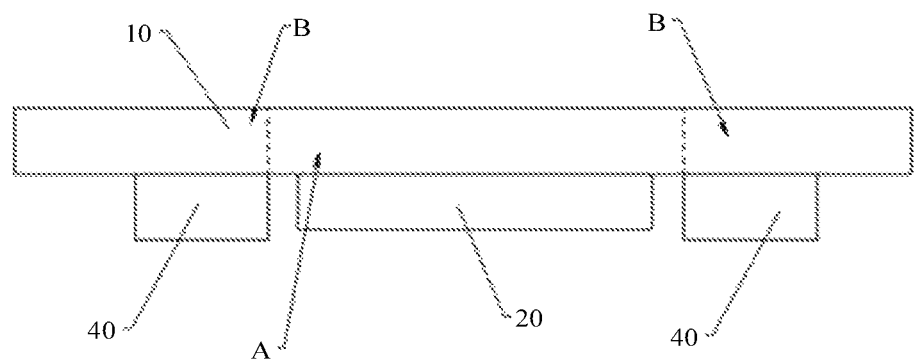
FIG. 5 is a schematic diagram of a touch button component according to an implementation of this application, where the touch button component includes a buffer zone.

As shown in FIG. 5, in an implementation, a buffer zone 40 is convexly disposed on the inner surface of the housing 10, that is, one or more bumps convexly disposed on the inner surface of the housing are disposed on the buffer zone. A region enclosed by the buffer zone 40 is a vibration region A, and a region between two dashed lines on the housing 10 in FIG. 5 is the vibration region A. The "enclosed" herein includes enclosed encircling, and also includes unenclosed encircling, for example, semi-encircling, or the buffer zone is formed on two opposite sides of the vibration sensor, that is, a structure similar to "( )" or "[ ]". The vibration sensor 20 (that is, the drive unit and/or the sensing detection unit) is attached to an inner surface of the vibration region A. The buffer zone 40 may be integrated with the housing 10, or the buffer zone 40 and the housing 10 may be of separate structures, and the buffer zone 40 is fixed on the inner surface of the housing 10 using a fixing method, such as bonding or welding. The buffer zone 40 is convexly disposed on the inner surface of the housing 10, which restricts the vibration region A such that vibration of the vibration sensor 20 affects only vibration of the vibration region A, and the buffer zone can absorb vibration of the vibration region A, thereby preventing vibration of the vibration region A from spreading to another part of the housing 10, that is, a region B beyond the two dashed lines in FIG. 5. Disposing of the buffer zone 40 further helps positioning and mounting the vibration sensor 20.

Figure 6:
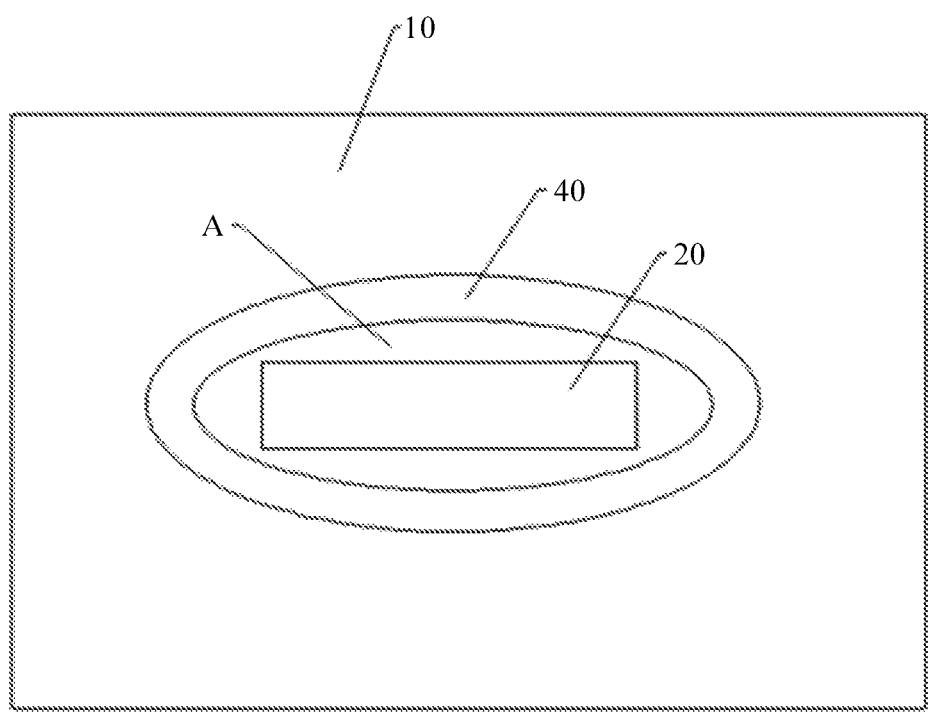
FIG. 6 is a schematic diagram of a touch button component according to an implementation of this application, where a buffer zone is of a closed ring structure.

In an implementation, there is one bump in the buffer zone 40, and the bump is in an enclosed ring structure around the vibration sensor 20. As shown in FIG. 6, a shape of the region surrounded by the buffer zone 40 may be a circular ring, an ellipse ring, a square ring, or the like. In a direction perpendicular to a casing, a shape of a cross section of the buffer zone 40 may be a square, a triangle, a trapezoid, a semicircle, or another irregular shape. A specific shape of the buffer zone is not limited in this application.

Figure 7:
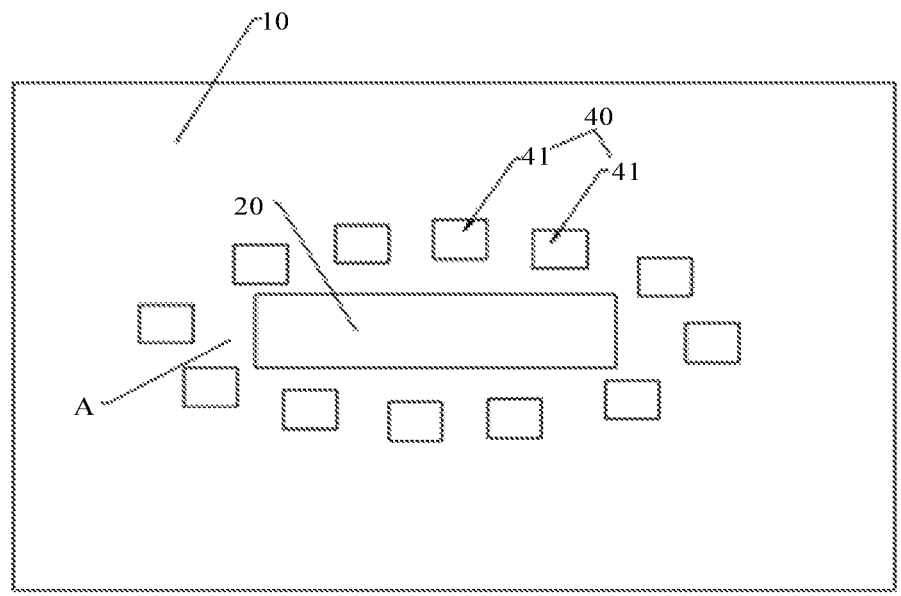
FIG. 7 is a schematic diagram of a touch button component according to an implementation of this application, where a buffer zone includes a plurality of bumps that are distributed in a ring shape.

In an implementation, as shown in FIG. 7, there are a plurality of bumps 41 in the buffer zone 40, and the plurality of bumps 41 are spaced apart around a periphery of the vibration sensor 20. That is, the plurality of bumps 41 are arranged in a ring shape, and a gap is provided between adjacent bumps 41. In a specific implementation, the plurality of bumps 41 are arranged equally.

Figure 8:
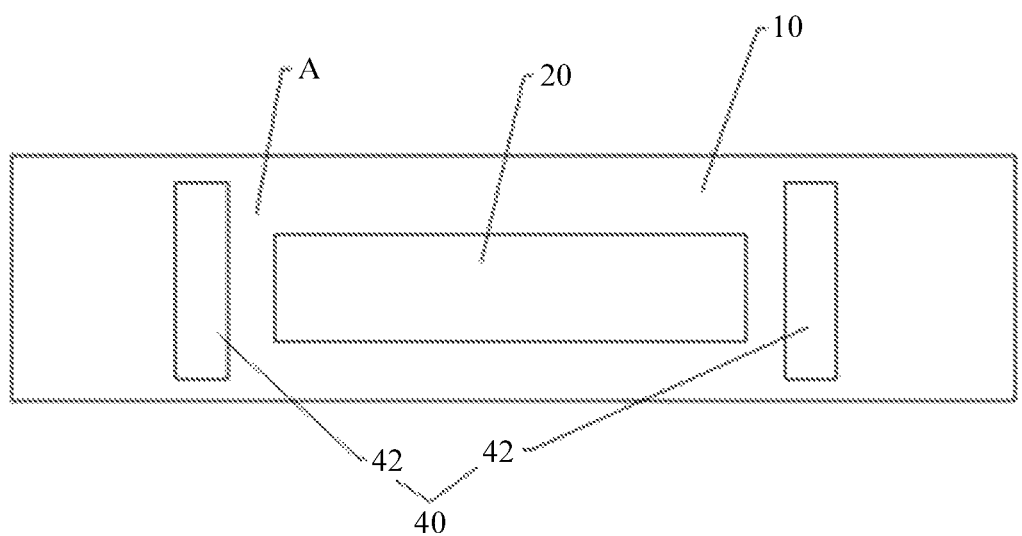
FIG. 8 is a schematic diagram of a touch button component according to an implementation of this application, where a buffer zone includes an architecture of a pair of partition walls that are disposed opposite to each other.

In an implementation, as shown in FIG. 8, there are two bumps 42, a vibration region A is formed between the two bumps 42, and the vibration sensor 20 (the drive unit and/or the sensing detection unit) is attached to an inner surface of the vibration region A. This implementation is applied to the middle frame of the mobile terminal, that is, the housing 10 is a part of the middle frame. On the middle frame, the two bumps 42 may be disposed at intervals only in a direction of extending the middle frame, to prevent vibration of the vibration region A from spreading outwards, thereby improving sensitivity and reliability of the touch button.

Figure 9:
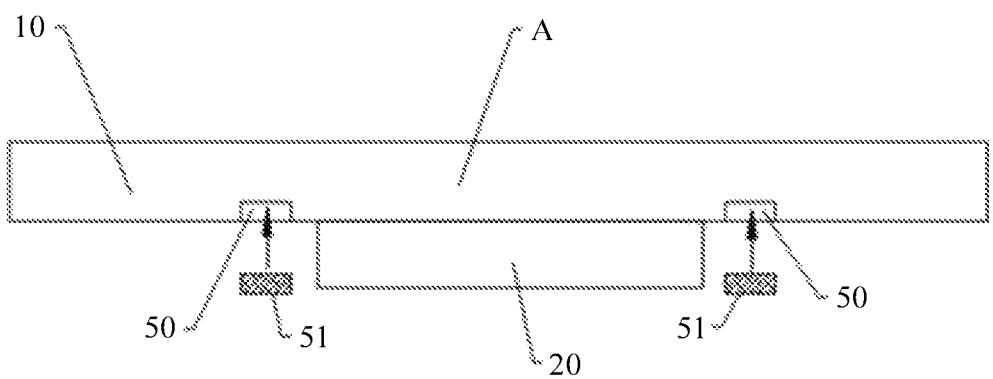
FIG. 9 is a schematic diagram of a touch button component according to an implementation of this application, where a groove is disposed on an inner surface of a housing, and is used to fill a flexible material or an elastic structure.
Figure 10:
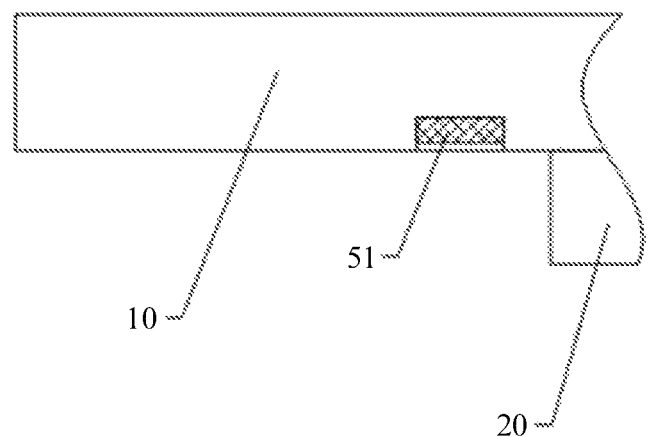
FIG. 10 is a schematic diagram of an implementation of the groove and the flexible material or the elastic structure shown in FIG. 9.
Figure 11:
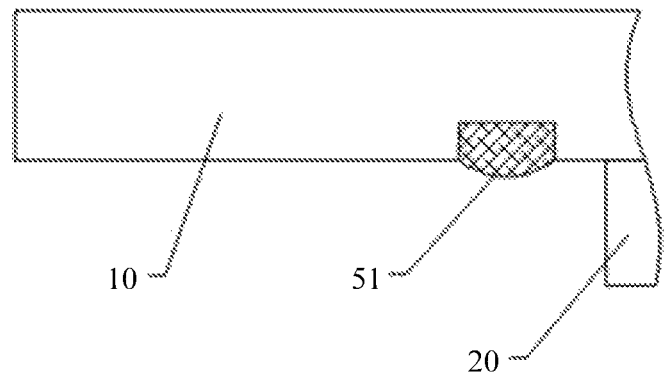
FIG. 11 is a schematic diagram of another implementation of the groove and the flexible material or the elastic structure shown in FIG. 9.

In an implementation, as shown in FIG. 9, a region that is on the housing 10 and that is used to attach to the vibration sensor 20 (the drive unit and/or the sensing detection unit) is a vibration region A, a groove 50 is disposed on the inner surface of the housing 10, the groove 50 is distributed on a periphery of the vibration region A, a filler 51 is disposed in the groove 50, and the filler 51 is a flexible material or an elastic structure, and is configured to absorb vibration of the housing 10. For ease of illustration and understanding, the filler 51 in FIG. 9 is decomposed outside the housing 10, that is, in a state in which the filler 51 is not filled into the groove 50. An arrow in FIG. 9 represents a filling direction. The flexible material may be silica gel, foam, or the like, and the elastic structure may be a structure such as a spring or a spring plate. Both the flexible material and the elastic structure have performance of vibration absorbing. The flexible material or the elastic structure disposed in the groove 50 can absorb vibration of the vibration region, to prevent vibration of the vibration region A from spreading outwards, thereby improving sensitivity and reliability of the touch button. The flexible material or the elastic structure in the groove 50 may fill only partial space of the groove 50 (as shown in FIG. 10), or may fully fill the groove 50 or exceed the groove 50 (as shown in FIG. 11).

Further, the groove 50 may be of a groove structure extending to form an enclosed ring, or the groove 50 may include a plurality of small grooves. The plurality of small grooves is arranged in a ring form, and two adjacent small grooves are spaced apart. A specific ring shape of the groove 50 through extension may be a circular ring, an ellipse ring, a square ring, or the like. In a direction perpendicular to a casing, a shape of a cross section of the groove may be a square, a triangle, a trapezoid, a semicircle, or another irregular shape. A specific shape of the groove is not limited in this application.

Figure 12:
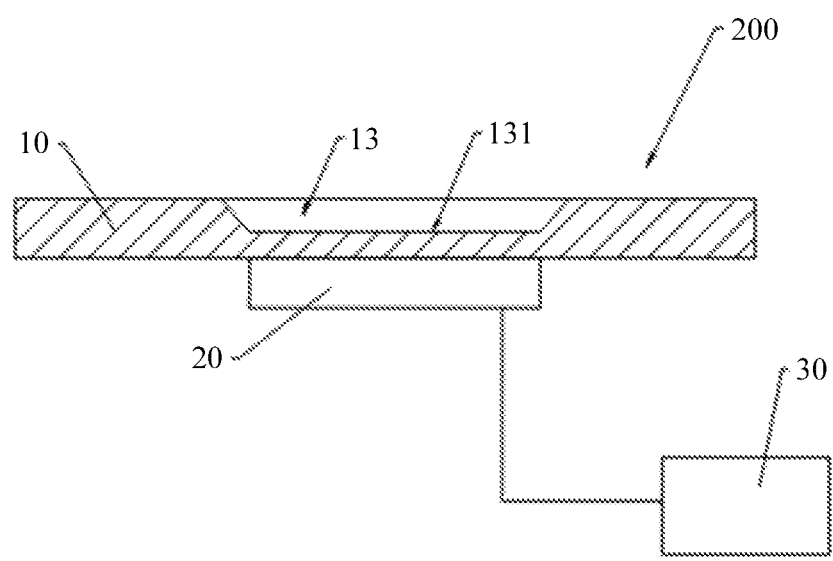
FIG. 12 is a schematic diagram of a touch button component according to an implementation of this application, where a recessed portion is disposed on an outer surface of a housing.

As shown in FIG. 12, in an implementation, a recessed portion 13 is disposed on the outer surface of the housing 10, and the vibration region is located at a bottom 131 of the recessed portion 13. The vibration region may include an entire region of the bottom 131 of the recessed portion 13, or the vibration region may include a partial region at the bottom 131 of the recessed portion 13. A thickness of the bottom 131 of the recessed portion 13 is less than a thickness of a part that is of the housing 10 and that is located on a periphery of the recessed portion 13. The vibration sensor 20 (the drive unit and/or the sensing detection unit) is attached to the inner surface of the vibration region. Disposing of the recessed portion 13 makes a region (that is, a sensitive region) that is of the housing 10 and that is for disposing the touch button thinner, to improve sensitivity of the touch button, and provides accurate positioning for the user. This is easy to operate and is not easy to cause an accidental touch.

This application further provides a vibration sensor component, including a housing and a vibration sensor. The vibration sensor includes a drive unit and a sensing detection unit. The drive unit is configured to generate vibration and drive the housing to vibrate. The sensing detection unit is configured to detect vibration of the housing and output a detection signal. A buffer zone is convexly disposed on an inner surface of the housing. A region enclosed by the buffer zone is a vibration region. One or more bumps convexly disposed on the inner surface of the housing are disposed on the buffer zone, and the drive unit and/or the sensing detection unit are/is attached to an inner surface of the vibration region. In such a solution, a touch button that is attached to the inner surface of the housing may be implemented, which facilitates integration of an electronic device. In addition, with a design of the buffer zone, vibration of the vibration region may be prevented from spreading to another part of the housing, thereby improving precision and reliability of the vibration sensor component, and implementing a function of preventing an accidental touch. If a user touches the housing except the vibration region, the touch force does not affect vibration of the housing in the vibration region, and does not trigger the vibration sensor component.

In another implementation, this application further provides a vibration sensor component, including a housing and a vibration sensor. The vibration sensor includes a drive unit and a sensing detection unit. The drive unit is configured to generate vibration and drive the housing to vibrate. The sensing detection unit is configured to detect vibration of the housing and output a detection signal. A region that is on the housing and that is used to attach to the drive unit and/or the sensing detection unit is a vibration region. The drive unit and/or the sensing detection unit are/is attached to an inner surface of the vibration region. A groove is disposed on an inner surface of the housing, the groove is distributed on a periphery of the vibration region, and the groove is filled with a flexible material or an elastic structure used to absorb vibration of the housing. A function of the groove in combination with the flexible material or the elastic structure in this implementation is similar to a function of the bump in the foregoing implementation.

Specific devices of the drive unit and the sensing detection unit in this application include the following implementations, which are described using examples. The drive unit may be of a piezoelectric plate structure or a drive structure including a magnetic part and a coil, and the sensing detection unit may be of a piezoelectric plate structure or a piezoresistive material. The following describes specific implementations of the drive unit and the sensing detection unit. This application is not limited to an architecture defined in the following implementations. All solutions in which the drive unit can generate vibration and drive the housing to vibrate, and the sensing detection unit can detect a vibration amplitude of the housing fall within the scope of this application.

Figure 13:
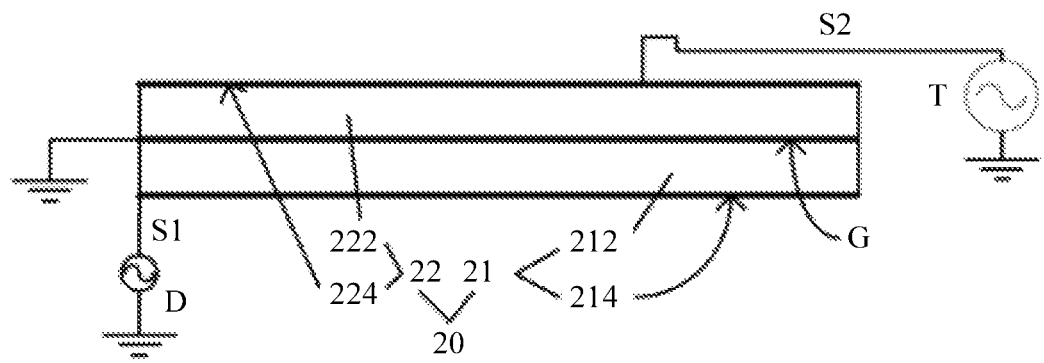
FIG. 13 is a schematic diagram of an implementation of a vibration sensor in a touch button component according to this application.

In an implementation, referring to FIG. 13, both the drive unit 21 and the sensing detection unit 22 in the vibration sensor 20 are of a piezoelectric plate structure. The drive unit 21 includes a first vibration sheet 212 configured to attach to the housing, a drive electrode 214 is disposed on a surface of the first vibration sheet 212, and the drive electrode 214 is configured to receive a drive signal S1 of a signal generation circuit D to generate vibration. In this implementation, the drive unit 21 is of a piezoelectric plate structure, and the first vibration sheet 212 is a carrier and may be a ceramic material. The drive electrode 214 is formed on the surface of the first vibration sheet 212 and is electrically connected to the signal generation circuit D. The signal generation circuit D generates a drive signal S1 for the drive electrode 214, the drive signal S1 may be an alternating current signal such as a square wave, a sine wave, or a triangular wave, and the drive electrode 214 generates vibration after receiving the drive signal S1.

The sensing detection unit 22 includes a second vibration sheet 222 and an induction electrode 224 formed on a surface of the second vibration sheet 222. The induction electrode 224 is configured to electrically connect to a detection circuit T, to transfer a vibration signal S2 to the detection circuit T. The detection circuit T is configured to output a detection signal. The second vibration sheet 222 and the first vibration sheet 212 are disposed in a laminated manner and are connected as a whole. Further, the drive unit 21 and the sensing detection unit 22 may be connected together using a bonding process or a co-firing process. The drive electrode 214 is located on a surface that is of the first vibration sheet 212 and that is away from the second vibration sheet 222, and the induction electrode 224 is located on a surface that is of the second vibration sheet 222 and that is away from the first vibration sheet 212. The touch button further includes a ground layer G. The ground layer G is sandwiched between the first vibration sheet 212 and the second vibration sheet 222. The sensing detection unit 22 and the drive unit 21 are grounded using the ground layer G. In an implementation, when the drive unit 21 enables the housing to generate forced vibration, the vibration is directly transferred to the sensing detection unit 22 that is fixedly integrated with the drive unit 21. Both the drive unit 21 and the sensing detection unit 22 are of a piezoelectric plate structure, which facilitates a piezoelectric effect of a piezoelectric material, and generation of electrical output, that is, the detection signal. The detection signal may be a vibration amplitude. When the housing is subjected to a touch force, the touch force suppresses vibration of the housing such that a vibration amplitude of the housing is weakened, a voltage amplitude output by the sensing detection unit 22 is also weakened, and an amplitude of the detection signal is less than the threshold. In this case, the comparison trigger unit outputs the trigger signal.

Figure 14:
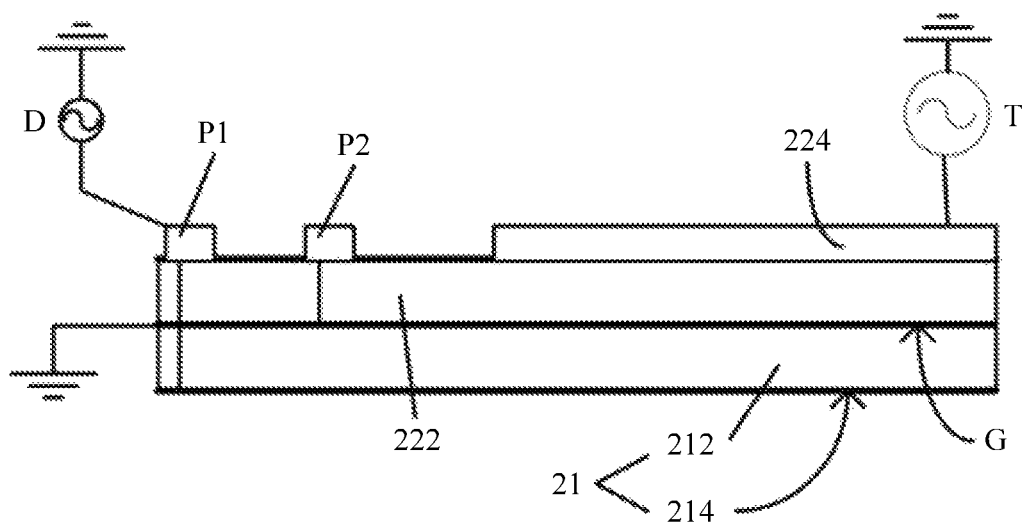
FIG. 14 is a schematic diagram of an implementation of a vibration sensor in a touch button component according to this application.

Referring to FIG. 14, in an implementation, a drive pad P1 is disposed on a surface that is of the second vibration sheet 222 and that is away from the first vibration sheet 212, the drive electrode is electrically connected to the drive pad, and the drive pad P1 is configured to electrically connect to the signal generation circuit. Further, the drive pad P1 may be electrically connected to the signal generating circuit D using a welding lead.

In an implementation, a ground pad P2 is disposed on a surface that is of the second vibration sheet 222 and that is away from the first vibration sheet 212. The ground pad P2 is used for grounding, and the ground layer G is electrically connected to the ground pad P2. The ground pad P2 and the drive pad P1 are located at edges of the second vibration sheet 222, and are insulated from the induction electrode 224. In this implementation, to ensure that the surface that is of the vibration sensor and that is attached to the housing is smooth, the ground pad P2 and the drive pad P1 are disposed on a surface that is of the second vibration sheet 222 and that is away from the first vibration sheet 212, and the first vibration sheet 212 is located between the second vibration sheet 222 and the casing 10. Such an architecture facilitates connection and wiring. Certainly, the ground pad P2 may alternatively be disposed on a side surface of the first vibration sheet 212 and the second vibration sheet 222.

Figure 15:
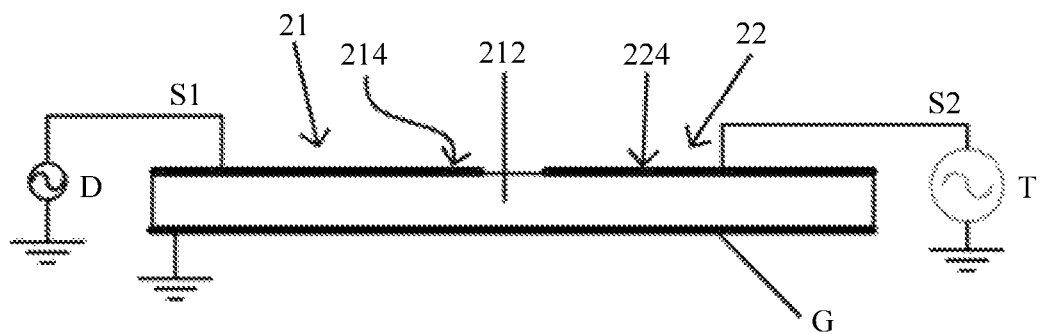
FIG. 15 is a schematic diagram of an implementation of a vibration sensor in a touch button component according to this application.

Referring to FIG. 15, in an implementation, the sensing detection unit 22 is disposed on the first vibration sheet 212. The sensing detection unit 22 includes an induction electrode 224. The induction electrode 224 is configured to electrically connect to a detection circuit T, to transfer a vibration signal S2 to the detection circuit T. The detection circuit T is configured to output a detection signal. The induction electrode 224 and the drive electrode 214 are located in different regions of the first vibration sheet 212. A ground layer G is further disposed on the first vibration sheet 212. In a direction perpendicular to the first vibration sheet 212, the ground layer G is separately opposite to the drive electrode 214 and the induction electrode 224. In this implementation, the drive unit 21 and the sensing detection unit 22 are disposed on a same vibration sheet, that is, the drive unit and the sensing detection unit are formed in different regions of one piezoelectric plate structure, respectively. Such a vibration sensor is applied to a mobile terminal, which helps effectively utilize internal space.

Further, in an implementation, the induction electrode 224 and the drive electrode 214 are disposed on a same surface of the first vibration sheet 212. The ground layer G is disposed on the other surface of the first vibration sheet 212. The surface on which the ground layer G is located is configured to attach to the housing 10. In another implementation, the induction electrode and the drive electrode are disposed on different surfaces of the first vibration sheet. The ground layer includes a first ground region and a second ground region that are distributed on different surfaces of the first vibration sheet. In a direction perpendicular to the first vibration sheet, the first ground region is opposite to the drive electrode, and the second ground region is opposite to the induction electrode.

Figure 16:
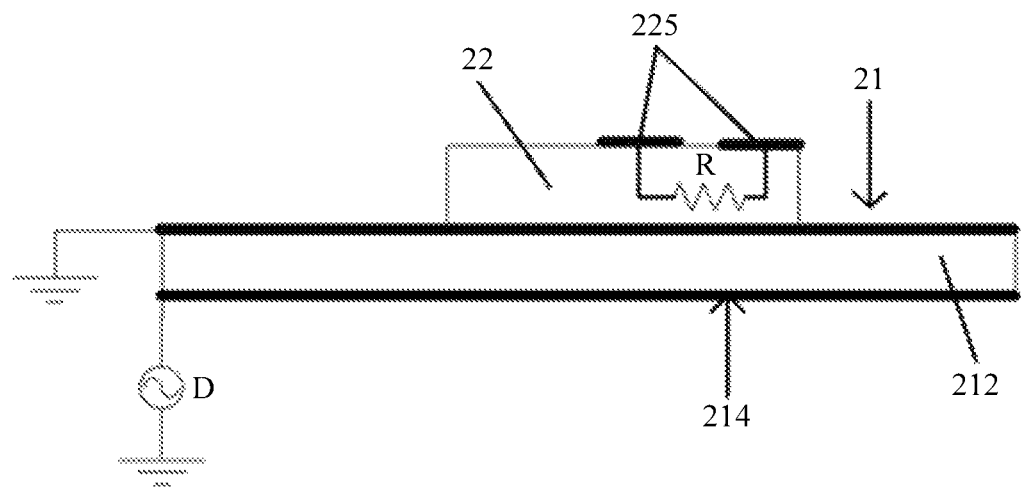
FIG. 16 is a schematic diagram of an implementation of a vibration sensor in a touch button component according to this application.

Referring to FIG. 16, in an implementation, the drive unit 21 is of a piezoelectric plate structure, and includes a first vibration sheet 212 that is attached to the housing. A drive electrode 214 is disposed on a surface of the first vibration sheet 212, and the drive electrode 214 is configured to receive a signal of a signal generation circuit D to generate vibration. The sensing detection unit 22 is made of a piezoresistive material, and the sensing detection unit 22 is attached to the first vibration sheet 212, that is, the sensing detection unit 22 made of the piezoresistive material is integrated with the first vibration sheet 212. The sensing detection unit 22 is configured to detect vibration of the housing 10 by detecting a resistance variation of the sensing detection unit 22 that is caused by vibration of the first vibration sheet 212. The sensing detection unit 22 forms a resistor R, and includes two output interfaces 225 located on two ends of the resistor R.

Figure 17:
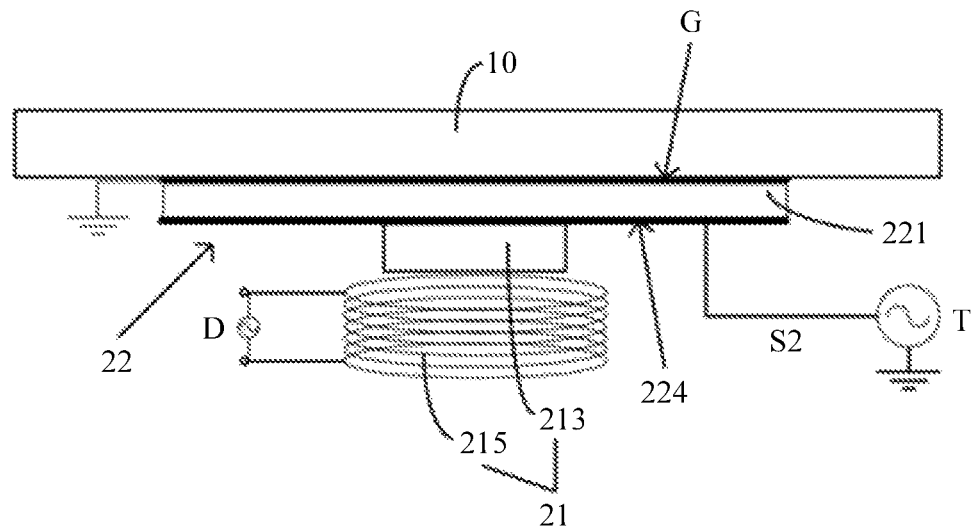
FIG. 17 is a schematic diagram of an implementation of a vibration sensor in a touch button component according to this application.

Referring to FIG. 17, in an implementation, the drive unit 21 includes a magnet 213 and a coil 215. The coil 215 is electrically connected to the signal generation circuit D. The signal generation circuit D drives the coil 215 to generate an electromagnetic force effect such that the magnet 213 generates vibration. Vibration of the magnet 213 drives the housing to vibrate. The magnet 213 is fixedly connected to the housing. In an implementation, the sensing detection unit 22 is of a piezoelectric plate structure, and the magnet 213 and the sensing detection unit 22 form an integrated structure. A specific structure is as follows. The sensing detection unit includes a vibration sheet 221, an induction electrode 224, and a ground layer G. The induction electrode 224 is configured to electrically connect to a detection circuit T, to transfer a vibration signal S2 to the detection circuit T. The detection circuit T is configured to output the detection signal. The induction electrode 224 and the ground layer G are located on two opposite surfaces of the vibration sheet 221, respectively. In a direction perpendicular to the vibration sheet 221, the ground layer G and the induction electrode 224 are opposite to each other. The magnet 213 is attached to the vibration sheet 221, to drive the vibration sheet 221 to vibrate, and the vibration sheet 221 is attached to the housing to drive the housing to vibrate. In this implementation, an architecture of a magnetic drive and a piezoelectric structure is used such that an amplitude can still be output at a low voltage, and the drive unit may even be used as local tactile feedback.

In an implementation, the vibration sheet 221 is attached to the housing, and the vibration sheet 221 is located between the magnet 213 and the housing 10. The magnet 213 is attached to a surface that is of the vibration sheet and on which the induction electrode 224 is disposed. The surface that is of the vibration sheet 221 and on which the ground layer G is disposed is attached to the housing 10.

Figure 18:
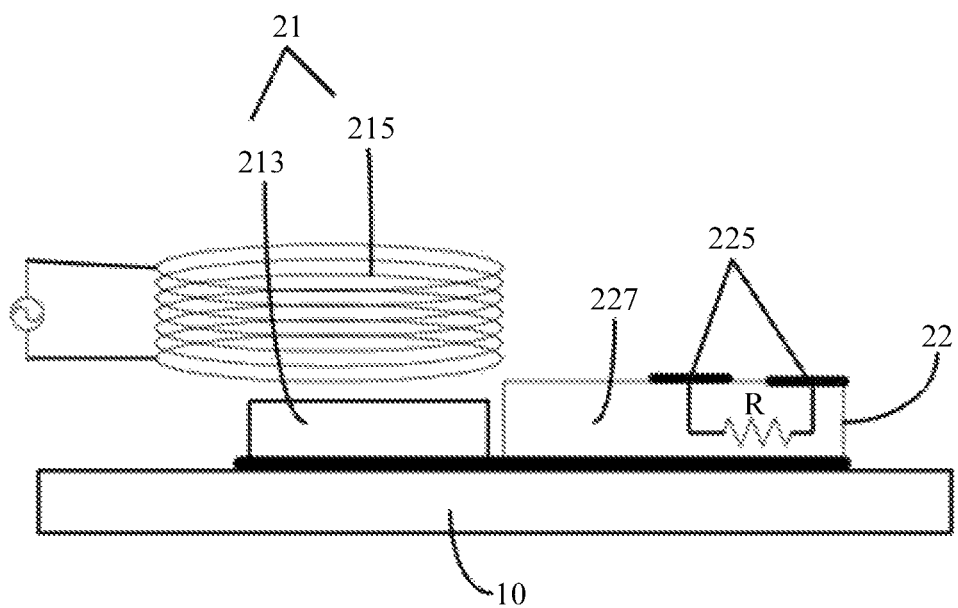
FIG. 18 is a schematic diagram of an implementation of a vibration sensor in a touch button component according to this application.

Referring to FIG. 18, in an implementation, the drive unit 21 includes a magnet 213 and a coil 215. The sensing detection unit 22 is made of a piezoresistive material, and the sensing detection unit 22 is attached to the magnet 213 or the housing 10. In other words, the sensing detection unit 22 may be attached to the magnet 213, and the magnet 213 is attached to the housing 10, or both the sensing detection unit 22 and the magnet 213 are attached to the housing 10. The sensing detection unit 22 and the magnet 213 may be connected or may not be connected. In this implementation, vibration of the housing is detected using a variation of a resistance value of the sensing detection unit 22.

In an implementation, the magnet 213 is attached to the housing. The sensing detection unit 22 includes a piezoresistive body 227 and two connection ends 225 disposed on a surface of the piezoresistive body 227. The piezoresistive body 227 is attached to the housing 10. The two connection ends 225 are located on a surface that is of the piezoresistive body 227 and that is away from the housing 10. The two connection ends 225 are configured to electrically connect to a piezoresistive detection circuit. The piezoresistive detection circuit is configured to output the detection signal based on a variation of a resistance value of the piezoresistive body, and the variation of the resistance value is an amplitude of the detection signal.

In an implementation, the sensing detection unit includes a sensing unit, an amplification circuit, and a filter circuit. The sensing unit is configured to sense vibration of the housing and output a signal, and the signal output by the sensing unit successively passes through the amplification circuit and the filter circuit to form the detection signal. The filter circuit is configured to filter out other stress interference such that the detection signal corresponds only to vibration information of the housing. When the sensing detection unit is the piezoelectric plate architecture in the foregoing solution, the signal output by the sensing unit is an amplitude signal of vibration of the housing, and when the sensing detection unit is made of the piezoresistive material in the foregoing solution, the signal output by the sensing unit is a resistance variation.

Figure 19:
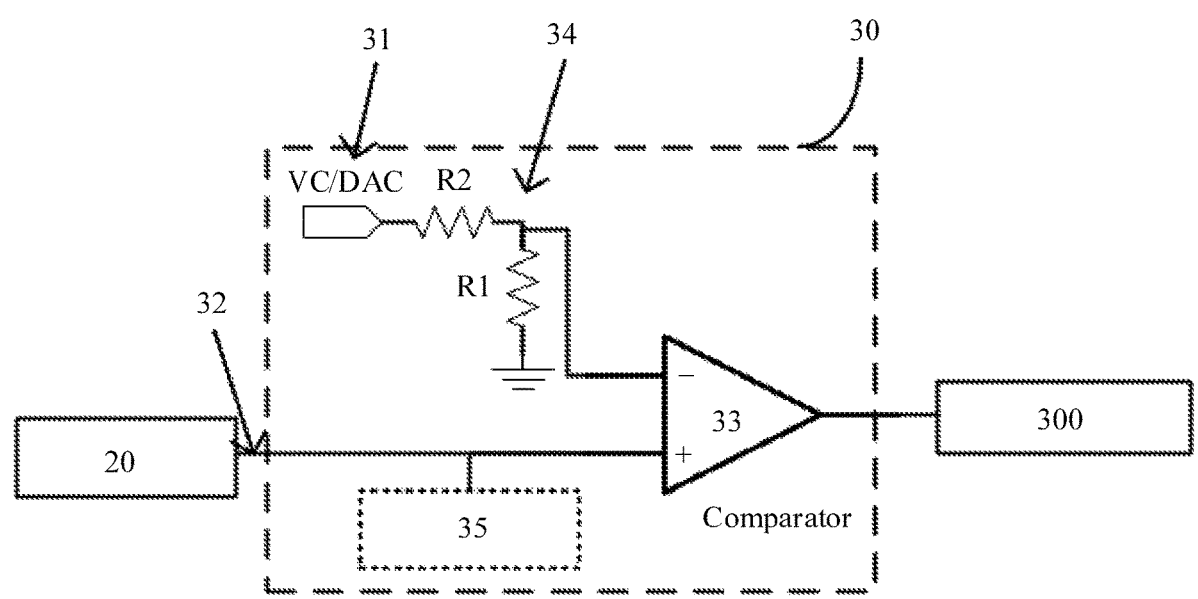
FIG. 19 is a schematic diagram of a comparison trigger unit in a touch button component according to this application.

Referring to FIG. 19, in an implementation, the comparison trigger unit 30 includes a reference amplitude input end 31, a detection signal input end 32, and a comparator 33. The comparator 33 transfers a signal to a control unit 300. The control unit 300 may be a circuit unit integrated in a master chip of the electronic device, or may be a circuit unit in a coprocessor. The control unit 300 may alternatively be a control chip that is independent of the master chip and the coprocessor. A first end of the comparator 33 is electrically connected to the reference amplitude input end 31, and is configured to input the threshold. A second end of the comparator 33 is electrically connected to the detection signal input end 32, and is configured to input the detection signal transferred by the sensing detection unit 20. The comparator 33 is configured to compare the amplitude of the detection signal with the threshold. An output end of the comparator 33 is electrically connected to the control unit 300, to output a comparison result to the control unit 300, and the control unit 300 is configured to output the trigger signal based on the comparison result of the comparator 33.

In an implementation, the comparison trigger unit 30 further includes a voltage division circuit 34. The voltage division circuit 34 is electrically connected between the reference amplitude input end 31 and the first end of the comparator 33. When the threshold is a voltage signal, the voltage division circuit 34 is configured to perform voltage division on the threshold, and then transfer the threshold to the first end of the comparator 33. The voltage division circuit 34 includes a resistor R1 and a resistor R2.

In an implementation, the touch button component further includes an amplitude discrimination unit 35. The amplitude discrimination unit 35 is configured to obtain a plurality of detection signals when an outer surface of the housing 10 is not subjected to the touch force, where the detection signal is used to indicate the vibration amplitude of the housing 10, and use a value with a highest occurrence probability in the plurality of detection signals as a reference value. The reference value is used to calculate the threshold. In an implementation, a specific algorithm for calculating the threshold is that the threshold is equal to a product of the reference value and a coefficient. A value range of the coefficient is 0.1-0.9. The amplitude discrimination unit 35 is electrically connected between the detection signal input end 32 and the second end of the comparator 33. When the outer surface of the housing is not subjected to the touch force, if amplitudes of the detection signals continuously read by the amplitude discrimination unit 35 remain stable, the amplitude discrimination unit 35 generates a reference value, and the reference amplitude input end 31 sets the reference value to the comparator 33.

In an implementation, an algorithm used by the amplitude discrimination unit 35 to generate the reference value is that the reference value=an amplitude of the detection signal read by the amplitude discrimination unit×a coefficient. A value range of the coefficient is 0.1-0.9. The coefficient is set based on experimental data and user experience, and is related to a material of the used housing and therefore is also related to an application environment.

In an implementation, the sensing detection unit includes a sensing unit, an amplification circuit, and a filter circuit. The sensing unit is configured to sense vibration of the housing and output a signal. The signal output by the sensing unit successively passes through the amplification circuit and the filter circuit to form the detection signal. The filter circuit is configured to filter out other stress interference such that the detection signal corresponds only to vibration information of the housing.

In an implementation, there are at least two touch button components. The mobile terminal further includes a general drive module. The general drive module asynchronously drives the drive units of the at least two touch buttons in sequence, to reduce crosstalk between the touch buttons. The following uses a first touch button and a second touch button as an example to describe in-sequence asynchronous driving. First, the drive unit of the first touch button is driven for a period of time (the period of time is in a millisecond unit, that is, several milliseconds or dozens of milliseconds). At the same time, the sensing detection unit of the first touch button performs detection. The comparison trigger unit of the first touch button performs determining, and then determines, based on a determining result, whether to trigger the first touch button. Then, driving of the first touch button is disabled, and the second touch button starts to be driven for the same period of time. At the same time, the sensing detection unit of the second touch button performs detection. The comparison trigger unit of the second touch button performs determining, and then determines, based on a determining result, whether to trigger the second touch button. If there are only two touch buttons, the two touch buttons are driven asynchronously in sequence (which may also be understood as cyclic driving in sequence). This driving and detection manner reduces interference between adjacent touch buttons.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A touch button component comprising:
a housing comprising a vibration region, wherein the vibration region comprises a first inner surface;
a vibration sensor comprising:
a drive system configured to drive the housing to vibrate; and
a sensing detection system configured to:
detect a vibration of the housing when the drive system drives the housing to vibrate; and
output a detection signal based on the vibration of the housing,
wherein the drive system or the sensing detection system is attached to the first inner surface; and
a comparison trigger system configured to:
receive the detection signal;
determine whether the detection signal falls within a first range conforming to a touch habit of a user; and
output a trigger signal when the detection signal falls within the first range.

2. The touch button component of claim 1, wherein the comparison trigger system is further configured to:
compare the detection signal with a threshold to obtain a comparison result, wherein the threshold is a boundary value of the first range;
output the comparison result; and
set the comparison result as the trigger signal when the comparison result indicates that the detection signal falls within the first range.

3. The touch button component of claim 2, wherein the threshold is between 0.1-0.9 times a lower limit of a second range of the detection signal, and wherein the sensing detection system is further configured to output the second range as a range of the detection signal when the housing is not touched.

4. The touch button component of claim 2, wherein the threshold is greater than or equal to 1.1 times an upper limit of a second range of the detection signal, and wherein the sensing detection system is further configured to output the second range as a range of the detection signal when the housing is not touched.

5. The touch button component of claim 2, further comprising an amplitude discrimination system configured to:
obtain a plurality of detection signals when an outer surface of the housing is not subjected to a touch force; and
set a value with a highest occurrence probability in the detection signals as a reference value to calculate the threshold, wherein the threshold is equal to a product of the reference value and a coefficient, and wherein a value range of the coefficient is between 0.1-0.9.

6. The touch button component of claim 1, wherein the detection signal indicates a vibration amplitude of the housing, and wherein the first range is an amplitude range of the vibration region after the vibration region receives a habit force from the user to trigger the touch button component.

7. The touch button component of claim 1, further comprising a buffer zone disposed on a second inner surface of the housing, wherein the buffer zone surrounds the vibration region, and wherein one or more bumps convexly disposed on the second inner surface are disposed on the buffer zone.

8. The touch button component of claim 1, further comprising a groove disposed on a second inner surface of the housing, and wherein the groove is distributed on a periphery of the vibration region and is filled with a flexible material.

9. The touch button component of claim 1, further comprising a groove disposed on a second inner surface of the housing, and wherein the groove is distributed on a periphery of the vibration region and is filled with an elastic structure.

10. The touch button component of claim 1, further comprising a recessed portion disposed on an outer surface of the housing, wherein the vibration region is located at a bottom of the recessed portion, and wherein a thickness of the bottom of the recessed portion is less than a thickness of a part that is of the housing and that is located on a periphery of the recessed portion.

11. An electronic device comprising:
a casing;
a touch button component comprising:
a housing comprising a vibration region, wherein the vibration region comprises a first inner surface, and wherein the housing is a part of the casing;
a vibration sensor comprising:
a drive system configured to drive the housing to vibrate; and
a sensing detection system configured to:
detect a vibration of the housing when the drive system drives the housing to vibrate; and
output a detection signal based on the vibration,
wherein the drive system or the sensing detection system is attached to the first inner surface; and
a comparison trigger system configured to:
receive the detection signal;
determine whether the detection signal falls within a first range conforming to a touch habit of a user; and
output a trigger signal when the detection signal falls within the first range; and
a chip configured to receive the trigger signal from the comparison trigger system.

12. The electronic device of claim 11, wherein the comparison trigger system is further configured to:
compare the detection signal with a threshold to obtain a comparison result, wherein the threshold is a boundary value of the first range;
output the comparison result; and
set the comparison result as the trigger signal when the comparison result indicates that the detection signal falls within the first range.

13. The electronic device of claim 12, wherein the threshold is between 0.1-0.9 times a lower limit of a second range of the detection signal, and wherein the sensing detection system is further configured to output the second range as a range of the detection signal when the housing is not touched.

14. The electronic device of claim 12, wherein the threshold is greater than or equal to 1.1 times an upper limit of a second range of the detection signal, and wherein the sensing detection system is further configured to output the second range as a range of the detection signal when the housing is not touched.

15. The electronic device of claim 12, further comprising an amplitude discrimination system configured to:
   obtain a plurality of detection signals when an outer surface of the housing is not subjected to a touch force; and
   set a value with a highest occurrence probability in the detection signals as a reference value to calculate the threshold, wherein the threshold is equal to a product of the reference value and a coefficient, and wherein a value range of the coefficient is 0.1-0.9.

16. The electronic device of claim 11, wherein the detection signal indicates a vibration amplitude of the housing, and wherein the first range is an amplitude range of the vibration region after the vibration region receives a habit force from the user to trigger the touch button component.

17. The electronic device of claim 11, further comprising a buffer zone disposed on a second inner surface of the housing, wherein the buffer zone surrounds the vibration region, and wherein one or more bumps convexly disposed on the second inner surface are disposed on the buffer zone.

18. The electronic device of claim 11, further comprising a groove disposed on a second inner surface of the housing, and wherein the groove is distributed on a periphery of the vibration region and is filled with a flexible material or an elastic structure.

19. The electronic device of claim 11, further comprising a recessed portion disposed on an outer surface of the housing, wherein the vibration region is located at a bottom of the recessed portion, and wherein a thickness of the bottom of the recessed portion is less than a thickness of a part that is of the housing and that is located on a periphery of the recessed portion.

20. The electronic device of claim 11, wherein the casing comprises a front panel, a middle frame, and a rear cover, and wherein the housing is an outside frame of the middle frame.

* * * * *